United States Patent [19]

Taguchi

[11] Patent Number: 4,801,989
[45] Date of Patent: Jan. 31, 1989

[54] DYNAMIC RANDOM ACCESS MEMORY HAVING TRENCH CAPACITOR WITH POLYSILICON LINED LOWER ELECTRODE

[75] Inventor: Masao Taguchi, Sagamihara, Japan

[73] Assignee: Fujitsu Limited, Kanagawa, Japan

[21] Appl. No.: 16,611

[22] Filed: Feb. 19, 1987

[30] Foreign Application Priority Data

Feb. 20, 1986 [JP] Japan .................. 61-036361
Mar. 3, 1986 [JP] Japan .................. 61-045822

[51] Int. Cl.$^4$ ........................................... H01C 29/78
[52] U.S. Cl. .................... 357/23.6; 357/54; 357/55; 357/59; 365/149
[58] Field of Search ............. 357/23.6, 55, 59, 54; 365/149

[56] References Cited

U.S. PATENT DOCUMENTS 4,672,410 6/1987 Miura et al. ................ 357/23.6

FOREIGN PATENT DOCUMENTS 108390 5/1984 European Pat. Off. ......... 357/23.6
0149799 7/1985 European Pat. Off. .
0171131 2/1986 European Pat. Off. .
59-213460 12/1983 Japan ...................... 357/23.6
59-141262 8/1984 Japan .
60-54472 of 1985 Japan .
61-15362 1/1986 Japan .

Primary Examiner—Joseph E. Clawson, Jr.
Attorney, Agent, or Firm—Armstrong, Nikaido, Marmelstein & Kubovcik

[57] ABSTRACT

In a dynamic random access memory having a trench capacitor, a first conductive layer is formed on all of the inner surface of the trench except for a region adjacent to the opening portion of the trench, a dielectric layer is formed on the first conductive layer exposed in the trench and the surface of the semiconductor substrate, and a second conductive layer of the other conduction type is filled in the trench through the dielectric layer. The first conductive layer, the dielectric layer, and the second conductive layer constitute a storage capacitor. In this dynamic random access memory, a metal insulator semiconductor transistor is formed in the semiconductor substrate, a source or drain region of the transistor of the other conduction type is in contact with the second conductive layer through the dielectric layer, and the second conductive layer is connected with the source or drain region of the other conduction type.

8 Claims, 9 Drawing Sheets

DYNAMIC RANDOM ACCESS MEMORY HAVING TRENCH CAPACITOR WITH POLYSILICON LINED LOWER ELECTRODE

BACKGROUND OF THE INVENTION

1. Field of the Invention

The present invention relates to a memory device, and more particularly, to a dynamic random access memory (DRAM) having a trench capacitor.

2. Description of the Related Art

In general, in a memory having a trench capacitor, the capacitor has a MOS structure wherein the capacitor is constructed in the form of a trench. This structure of the trench capacitor effectively increases the area of the capacitor, and accordingly, it is possible to provide a small size trench capacitor having a large storage capacitance.

In the prior art memory having a trench capacitor, sometimes the concentration of impurities in the semiconductor substrate is usually low, for example, the substrate impurity concentration $2 \times 10^{15}$ cm$^{-3}$. In a prior art device including a semiconductor substrate having a low impurity concentration, a punch-through phenomena can occur between the trench capacitor of the memory cell in question and the trench capacitor of the adjacent memory cell, due to an extension of the depletion layer formed in the substrate. This punch-through phenomena is undesirable, since it causes an electrical coupling between adjacent trench capacitors, and accordingly, the stored data is sometimes lost and the memory system becomes less reliable.

In the prior art memory having a trench capacitor, sometimes the so-called Hi-C capacitor structure can be adopted to make the cell plate voltage half-way between Vcc and Vss. In a prior art device having a so-called Hi-C capacitor structure, onset of diffused layer around the trench to form the storage electrode makes the distance between adjacent capacitors still less. This structure leads to the increase of possibility of punch-through between cells. This situation is also undesirable.

Also, in the prior art memory having a trench capacitor, the depletion layer widely expands from the storage electrode in the substrate since the minority carriers produced in the substrate by any means, such as by incidence of an alpha-particle, are quickly captured in the depletion layer to the storage electrode, the possibility of soft errors due to alpha ray irradiation is increased. An increase in the possible occurrence of soft errors is also undesirable.

Further, in the prior art memory having a trench capacitor with inversion layer type electrode, the maximum voltage written into the cell is limited by the cell-plate voltage and lowered by the threshold voltage loss, of forming inversion layer electrons. For example, the maximum available write voltage is reduced to about 1 volt lower than the power source voltage. This reduction of the write voltage from the power source voltage is also undesirable.

SUMMARY OF THE INVENTION

It is an object of the present invention to provide an improved dynamic random access memory having a trench capacitor in which the punch-through phenomena between adjacent trench capacitors due to an extension of the depletion layer is prevented.

It is another object of the present invention to provide an improved dynamic random access memory having a trench capacitor in which the possibility of soft errors is reduced.

The other objects of the present invention will be better understood from the description of the preferred embodiments described below with reference to the drawings.

In accordance with the present invention, there is provided a dynamic random access memory having a trench capacitor. The memory includes a semiconductor substrate of one conduction type. A trench is formed in the semiconductor substrate. A first conductive is layer formed on the inner surface of the trench except for a region adjacent to the opening portion of the trench. A dielectric layer is formed on the first conductive layer exposed in the trench and the surface of the semiconductor substrate. A second conductive layer is filled in the trench through the dielectric layer. The first conductive layer, the dielectric layer, and the second conductor layer constitute a storage capacitor. In this dynamic random access memory, a metal insulator semiconductor transistor is formed in the semiconductor substrate which has a source or drain region of the other conduction type which is connected to the second conductor layer.

DESCRIPTION OF THE PREFERRED EMBODIMENTS ((Basic Description Concerning FIG. 1))

Figure 1:
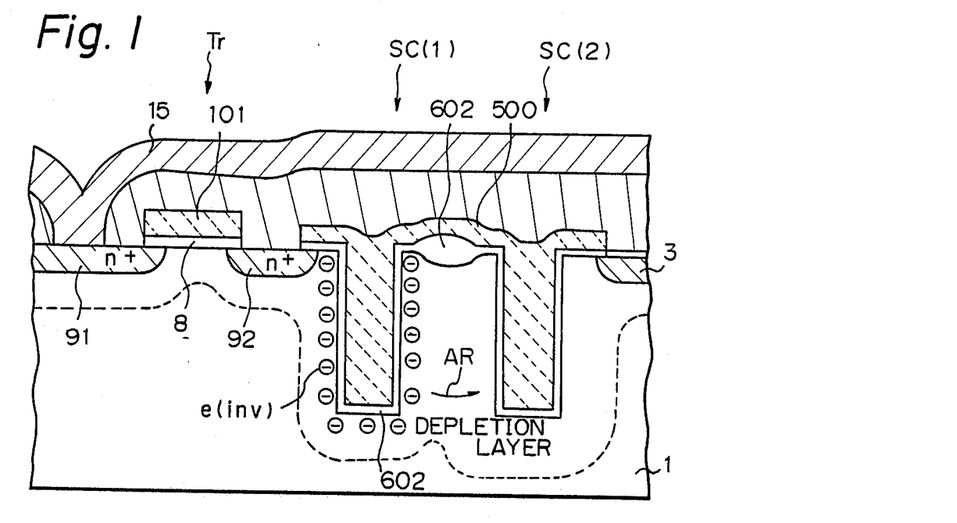
FIG. 1 shows a prior art dynamic random access memory having a trench capacitor.

Before describing the preferred embodiments of the present invention, a prior art dynamic random access memory (DRAM) having a trench capacitor shown FIG. 1 is described. The DRAM of FIG. 1 includes a semiconductor substrate 1 of p type silicon, an isolation layer 3 of silicon dioxide configuring a cell region and a dielectric layer 602, and a cell plate 500 as the counter electrode consisting of polycrystalline silicon (polysilicon). Inversion layer electrons e(inv) exist in the substrate 1 around the dielectric layer 602. The storage capacitor SC(1) is formed by the inversion layer electrons e(inv), the dielectric layer 602, and the cell plate 500. The DRAM of FIG. 1 also includes a gate dielectric layer 8, a word line 101 consisting of polysilicon, and high concentration impurity introduced regions 91 and 92 which form the n+ type source or drain regions. A MIS field effect transistor Tr is formed by the source or drain regions 91 and 92, and the word line 101 as the gate. The DRAM of FIG. 1 also includes a bit line 15 which is in contact with the source or drain region 91 and is arranged perpendicularly to the word line 101. The storage capacitor SC(1) and the source or drain region 92 the MIS transistor Tr is connected by an inversion layer electrons e(inv). Thus, the storage electrode for storing an information electric charge is constituted by the region of the inversion layer electrons e(inv). In the DRAM of FIG. 1, a depletion layer is formed in the substrate 1 as shown by the broken line in FIG. 1.

In the DRAM of FIG. 1, the storage capacitor SC(2) of the adjacent memory cell is located adjacent to the storage capacitor SC(1) of the memory cell in question. The arrow AR in FIG. 1 represents an occurrence of the punch-through phenomena.

((Embodiment of FIGS. 2 and 3))

Figure 2:
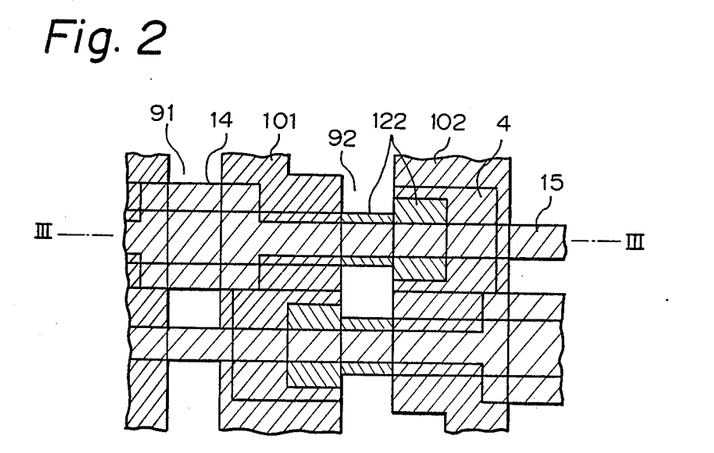
FIG. 2 is a plan view of a dynamic random access memory having a trench capacitor according to a preferred embodiment of the present invention.
Figure 3:
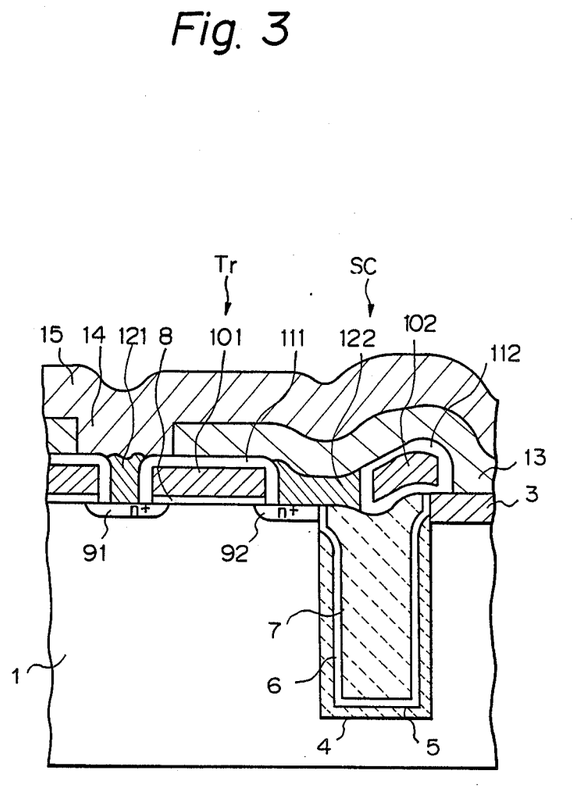
FIG. 3 is a cross-sectional view of FIG. 2 taken along the line III—III.

A dynamic random access memory having a trench capacitor according to a preferred embodiment of the present invention is shown in FIGS. 2 and 3. A cross-sectional view of FIG. 2 taken along the line III—III is shown in FIG. 3.

The memory of FIGS. 2 and 3 includes a silicon semiconductor substrate 1 of, for example, a p type, as one of the conduction types, an insulation layer 3 of, for example, silicon dioxide, for configuring a cell region, and a trench 4 formed in the substrate 1.

In the memory of FIGS. 2 and 3, the first conductive layer 5 of p+ type polycrystalline silicon (polysilicon) formed on the entire inner surface of the trench 4 except for a region adjacent to the opening of the trench 4 constitutes the cell plate (counter electrode) of the storage capacitor. A dielectric layer 6 of silicon nitride $Si_3N_4$ is also provided. The second conductive layer 7 of an $n^{+0187}$ type poly silicon filled in the trench 4 through the dielectric layer 6 constitutes the storage electrode of the storage capacitor. The storage capacitor is constituted by the cell plate 5, the dielectric layer 6, and the storage electrode 7.

The memory of FIGS. 2 and 3 also includes the silicon dioxide $SiO_2$ gate dielectric layer 8, the n+ type source or drain region 91, 92, the gate electrode 101 as the word line 101 of the memory cell in question constituted by titanium silicide $TiSi_2$, and the gate electrode 102 as the word line 101 of the adjacent memory cell. The p type silicon substrate 1, the gate dielectric layer 8, the n+ type source or drain region 91, 92, and the word line constitute the transistor of the memory cell in question.

The memory of FIGS. 2 and 3 also includes the silicon dioxide $SiO_2$ insulator layer 111, and the third conductive layer 122 of n+ type polysilicon which electrically connects a source or drain region 92 with the storage electrode 7 of the storage capacitor.

The memory of FIGS. 2 and 3 further includes the inter-layer insulator layer 13, the window 14 for wiring contact, and the bit line 15 of aluminum which is in contact with the source or drain region 91 and extends in the direction perpendicular to the direction of the word line on the inter-layer insulator layer.

In the memory of the trench capacitor cell type of FIGS. 2 and 3, the electrical connection between the source or drain region 92 and the storage electrode 7 of the storage capacitor is realized by the third conductor layer 122. Hence, the second conductor layer 7 in the trench 4 is the storage electrode, and the first conductive layer 5 in the substrate side is the cell plate of the storage capacitor. This arrangement of the storage electrode and the cell plate is the reverse of that of the prior art arrangement.

In the memory of FIGS. 2 and 3, the third conductive layer 122, which connects the source or drain region 92 with the storage electrode 7, can be formed in a self alignment manner to the word line without using a masking process, by a process of selective growth of polysilicon on the silicon surface appearing between the word lines 101 and 102. The electrical separation of the source or drain region 92 from the cell plate 5 is realized by the source-drain junction.

In the memory of FIGS. 2 and 3, a leakage of the stored charge due to the punch-through phenomena between the adjacent storage capacitors is prevented. Also, a disturbance of the stored data caused by charging or discharging of the adjacent storage capacitor through the static coupling between capacitors is avoided. Also, the possibility of soft-errors is reduced due to the structure in which the storage electrode is surrounded by the insulation layer and also the cellplate, and thus the depletion layer do not extend to reach to neighboring cells. Also, the reduction of the write voltage from the power source voltage is prevented, since the storage capacitor consists of the n+ type polysilicon, the dielectric layer, and the p+ type polysilicon, and an inversion layer which accompanies with threshold voltage loss to form the layer is not used.

((Process of Producing the Memory of FIGS. 2 and 3))

An example of the process of producing the memory of FIGS. 2 and 3 is illustrated in FIGS. 4A, 4B, 5A, 5B, 6A, 6B, 7A, 7B, 8A, 8B, 9A, and 9B. FIGS. 4A to 9A represent plan views, and FIGS. 4B to 9B represent the corresponding cross-sectional views.

Figure 4A:
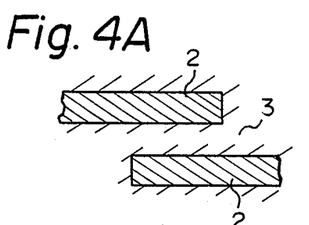
FIGS. 4A, 5A, 6A, 7A, 8A, and 9A show examples of a process of producing the memory of FIGS. 2 and 3, in a plan view.
Figure 4B:
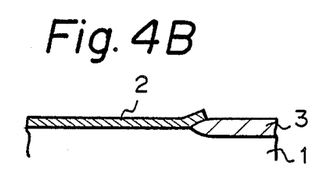
FIGS. 4B, 5B, 6B, 7B, and 8B show cross-sectional views corresponding to FIGS. 4A, 5A, 6A, 7A, 8A, and 9A.

As shown in FIGS. 4A and 4B, an oxidization masking layer 2 for selective oxidization of silicon substrate consisting of, for example, silicon nitride $Si_3N_4$, or a composite layer of silicon nitride $Si_3N_4$ and silicon dioxide $SiO_2$, is formed on the element formation region of the surface of the p type silicon substrate 1. The silicon substrate 1 is then oxidized, so that a silicon dioxide layer 3 having a thickness of, for example, 4000 angstrom, is formed as the field isolation layer.

Figure 5A:
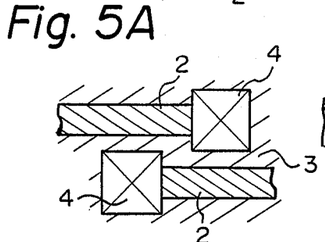
Figure 5B:
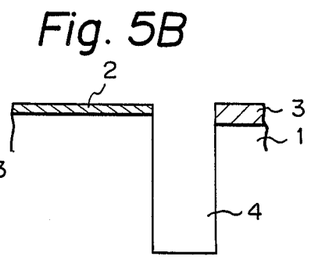

As shown in FIGS. 5A and 5B, a trench 4 having a depth of, for example, 3 to 4 μm, is formed in the non-oxidized region including the field insulation layer 3, by the usual lithographical process and reactive ion etching (RIE) process.

Figure 6A:
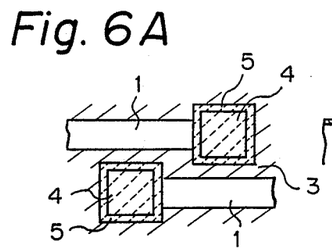
Figure 6B:
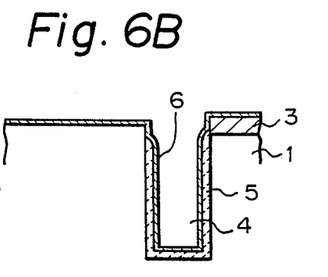

As shown in FIGS. 6A and 6B, polycrystalline silicon (polysilicon) layer doped to be p+ type is grown to a thickness of, for example, 2000 angstrom, on the entire surface of the substrate 1 including the inner surface of the trench 4. Then, the polysilicon layer in the other region except for the inner surface of the trench 4 is eliminated by anisotropic dry etching, such as the RIE process, in the direction perpendicular to the surface of the substrate. Thus, the p+ type poly silicon layer 5 is formed in the trench 4 as the first conductive layer.

A portion of the polysilicon layer 5 in the region in the vicinity of the opening of the trench, such as down to a depth of, for example, 0.5 $\mu$m, from the opening of the trench, is selectively deleted by, for example, an over etching process. This deletion is advantageous for enhancing the breakdown voltage of the junction of the source or drain region of the transistor.

The formation of the p+ type polysilicon layer 5 is directed to the establishment of a region having the same conduction type as the substrate and a high impurity concentration on the inner surface of the trench 4 so that the substrate acts as the cell plate.

The oxidization masking layer 2 is then removed to expose the surface of the silicon, and the dielectric layer 6 of silicon nitride $Si_3N_4$, silicon dioxide $SiO_2$, or a composite of these substances having a thickness of, for example, 100 angstrom, is formed on the entire surface of the substrate including the inner surface of the trench 4 by an oxidation or growth process. It is known that the insulation breakdown voltage of this oxidization-resistant coating is enhanced by annealing in an oxygen atmosphere.

The thus-formed layer constitutes the dielectric layer 6 of the storage capacitor.

Figure 7A:
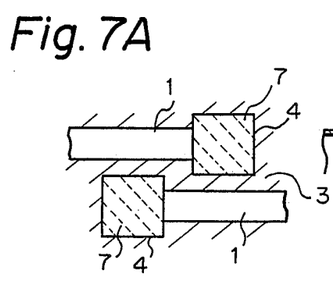
Figure 7B:
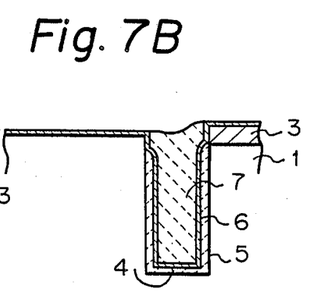

As shown in FIGS. 7A and 7B, a p+ type doped polysilicon layer in grown on the substrate 1 including the inner surface of the trench 4 to a thickness necessary to fill the trench 4. The n+ type poly silicon layer 7 is formed as the second conductive layer acting as the storage electrode, leaving a portion of the polysilicon layer to an amount such that the polysilicon layer exists only a little in the periphery of the trench 4 by an etching process in which the predominant etching direction is in the direction perpendicular to the surface of the substrate.

Figure 8A:
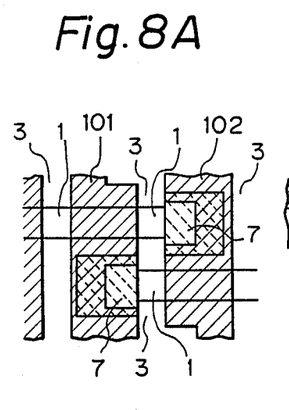
Figure 8B:
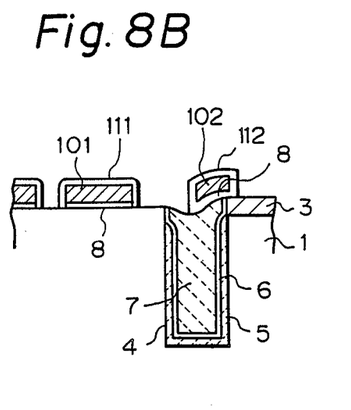

As shown in FIGS. 8A and 8B, the silicon nitride $Si_3N_4$ dielectric layer 6 appearing outside of the trench 4 is removed to expose the surface of the silicon substrate 1. Then, the surface of the substrate 1 is oxidized by the usual process for forming a MOS transistor to form a silicon dioxide $SiO_2$ gate dielectric layer 8 having a thickness of, for example 280 angstroms. When the oxidation is carried out at a relatively low temperature, for example, 900° C., the thickness of the silicon dioxide layer 8 on the surface of the n+ type polysilicon layer 7 as the storage electrode becomes, for example, 600 angstrom.

The gate material such as titanium silicide $TiSi_2$ having a thickness of, for example, 2000 angstroms, is deposited on the main surface of the wafer. This gate material is then coated with a silicon dioxide layer 111 having a thickness of, for example, 1500 angstrom, and patterned so that a pattern of a word line of titanium silicide having the silicon dioxide layer in the upper portion is formed.

Then, a silicon dioxide layer 112 having a thickness of, for example, 1500 angstrom, is again deposited on the main surface. Hence, the silicon dioxide layer 111 or 112 is remained on the upper and side surface of the word line by an anisotropic etching process, and thus word lines 101 and 102 of titanium silicide are covered with silicon dioxide layer. In this case, the portion of the silicon substrate 1 not covered by the word lines and the surface of the polysilicon filled in the trench 4 are exposed.

Figure 9A:
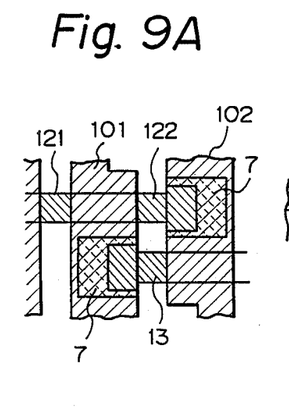
Figure 9B:
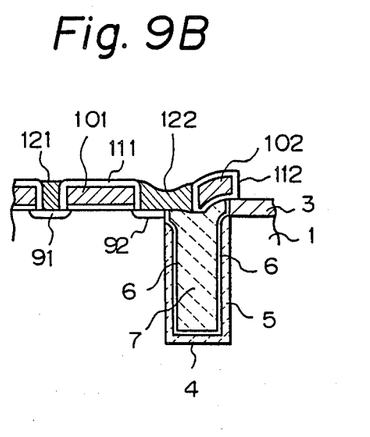

As shown in FIGS. 9A and 9B, phosphor or arsenic is ion-implanted selectively using the word lines for gate electrodes as the mask to form n+ type source or drain regions 91 and 92. At the same time, a highly n-type impurity doped region is formed in the n+ type polysilicon layer 7 filled in the trench 4.

Then, a selective growth of a polysilicon layer having a thickness of, for example, 2000 angstroms, to which phosphor or arsenic is doped with high concentration, is carried out on the substrate 1 by a selective vapor phase growth process.

In this case, a polysilicon layer is not grown over the silicon dioxide layers 11 and 3, and third conductive layers 121 and 122 of n+ type polysilicon are formed on the source or drain regions 91 and 92 and the upper region of the n+ type polysilicon layer 7 as the storage electrode. The n+ type polysilicon layer is not grown on the exposed edge of the dielectric layer 6. But, since the thickness of the dielectric layer is very small, for example, 100 angstrom, the polysilicon layer over the source or drain region 92 and the polysilicon layer over the storage electrode 7 form a continuous third conductor layer, so that the source or drain region 92 becomes conductive with the storage electrode 7.

Subsequently, an inter-layer insulation layer 13 is formed on the entire surface of the substrate, a contact window 14 is opened over the source or drain region 91 where a bit line is to be in contact with a memory cell, and a bit line 15 consisting of, for example, aluminum, is formed to realize the structure shown in FIGS. 2 and 3.

((Alternative Embodiments))

Figure 10A:
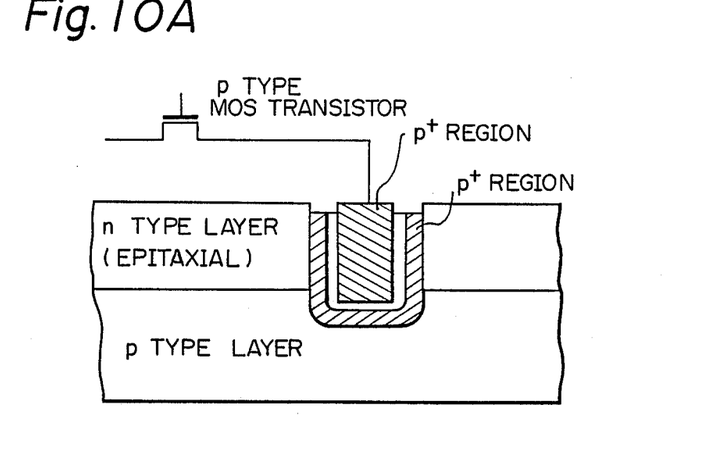
FIG. 10A shows an alternative structure of the memory of FIGS. 2 and 3.

Instead of the structure of the dynamic random access memory shown in FIGS. 2 and 3, it is possible to adopt an alternative structure in which the storage capacitor is formed partially in the p type substrate and partially in the n type layer expitaxially grown on the p type substrate, as shown in FIG. 10A. In the structure of FIG. 10A, the transistor is a p type MOS transistor, the second conductive layer is p+ type, and the first conductive layer is p+ type.

Figure 10B:
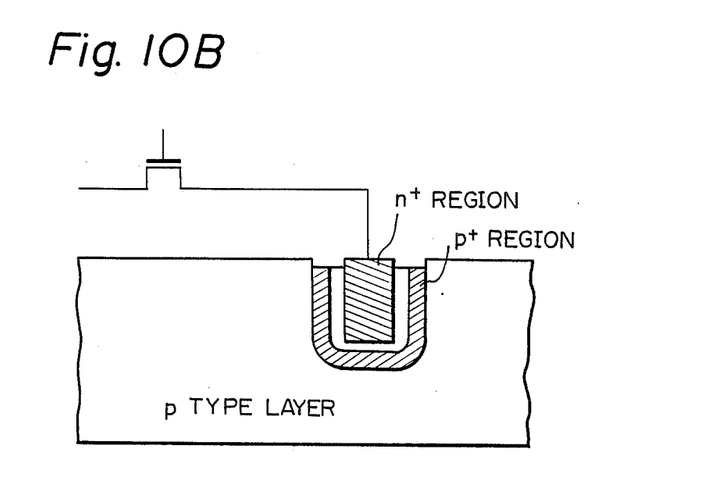
FIG. 10B shows the structure of the memory of FIGS. 2 and 3.

FIG. 10A is drawn in a model manner. In this connection, FIG. 10B is a model manner drawing of the structure of the memory of FIGS. 2 and 3.

Also, instead of the structure of the dynamic random access memory shown in FIGS. 2 and 3, in which the substrate is p type, and the source or drain region and the storage electrode are n+ type, it is possible to adopt an alternative structure in which the substrate is n type, and the source or drain region and the storage electrode are p+ type.

((Embodiment of FIGS. 11 and 12))

Figure 11:
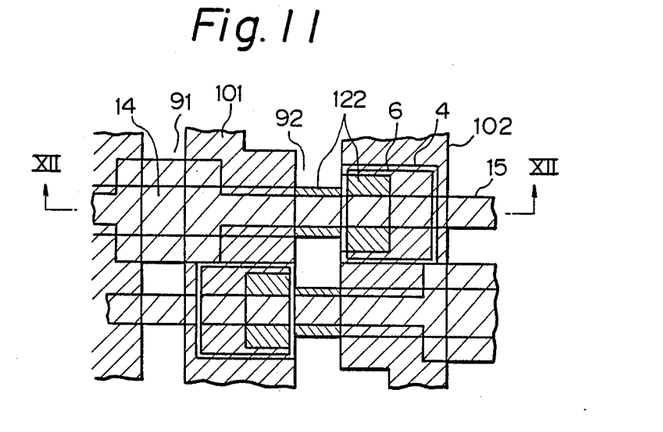
FIG. 11 is a plan view of a dynamic random access memory having a trench capacitor according to another embodiment of the present invention.
Figure 12:
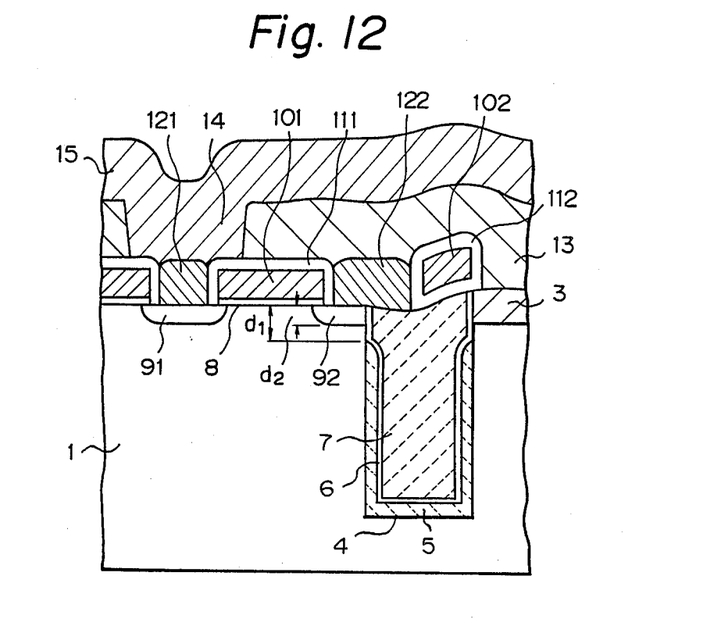
FIG. 12 is a cross-sectional view of FIG. 11 taken along the line XII—XII.

A dynamic random access memory having a trench capacitor according to another embodiment of the present invention is shown in FIGS. 11 and 12. A cross-sectional view of FIG. 11 taken along the line XII—XII is shown in FIG. 12.

The memory of FIGS. 11 and 12 includes a silicon semiconductor substrate 1 of, for example, a p type as one of the conduction types, an isolation layer 3 of, for example, silicon dioxide, for configuring a cell region, and a trench 4 formed in the substrate.

In the memory of FIGS. 11 and 12, the first conductor layer 5 of p+ type polysilicon is formed on the entire inner surface of the trench 4, except for a region adjacent to the opening of the trench 4, down to the depth of d, and constitutes the cell (counter electrode) of the storage capacitor. A dielectric layer 6 of silicon nitride $Si_3N_4$ is also provided. The second conductor layer 7 of an n+ type polysilicon filled in the trench 4 through the dielectric layer 6 constitutes the storage electrode of the storage capacitor. The storage capacitor is constituted by the cell plate 5, the dielectric layer 6, and the storage electrode 7.

The memory of FIGS. 11 and 12 also includes the silicon dioxide $SiO_2$ gate dielectric layer 8, the n+ type source or drain region 91, 92, the gate electrode 101 as the word line 101 of the memory cell in question constituted by titanium silicide $TiSi_2$, and the gate electrode 102 as the word line 101 of the adjacent memory cell. The p type silicon substrate 1, the gate dielectric layer 8, the n+ type source or drain region 91, 92, and the word line constitute the transistor of the memory cell in question.

The memory of FIGS. 11 and 12 also includes the insulator layer 11 of silicon dioxide $SiO_2$, and the portion 121 of the third conductor layer of n+ type polysilicon. The portion 122 of the third conductor layer of n+ type polysilicon electrically connects a source or drain region 92 with the storage electrode 7 of the storage capacitor.

The memory of FIGS. 11 and 12 further includes the inter-layer insulator layer 13, the window 14 for wiring contact, and the bit line 15 of aluminum which is in contact with the source or drain region 91 and extends in the direction perpendicular to the direction of the word line on the inter-layer insulator layer.

In the memory of the trench capacitor cell type of FIGS. 11 and 12, the electrical connection between the source or drain region 92 and the storage electrode 7 of the storage capacitor is realized by the third conductor layer 121 and 122. Hence, the second conductive layer 7 in the trench 4 is the storage electrode, and the first conductive layer 5 in the substrate side is the cell plate of the storage capacitor. This arrangement of the storage electrode and the cell plate is the reverse of that of the prior art arrangement.

In the memory of FIGS. 11 and 12, the third conductive layer 122, which connects the source or drain region 92 with the storage electrode 7, can be formed in a self alignment manner to the word line without using the masking process, by a process of selective vapor phase growth on the silicon surface appearing between the word lines 101 and 102.

In the memory of FIGS. 11 and 12, the upper end of the p+ type polysilicon cell plate 5 coated on the inner surface of the trench 4 is limited to the depth $d_1$ from the level of the opening of the trench 4, which is deeper than the depth $d_2$ which is the bottom of the n+ type source or drain region 92. Hence, there is a separation between the cell plate 5 and the bottom of the source or drain region 92. Accordingly, the n+ type source or drain region 92 having a high impurity concentration do not directly touch the p+ type cell plate 5. Therefore, deterioration of the breakdown voltage for the source or drain junction 92 caused by p+n+junction is readily avoided.

((Embodiment of FIGS. 13 and 14))

Figure 13:
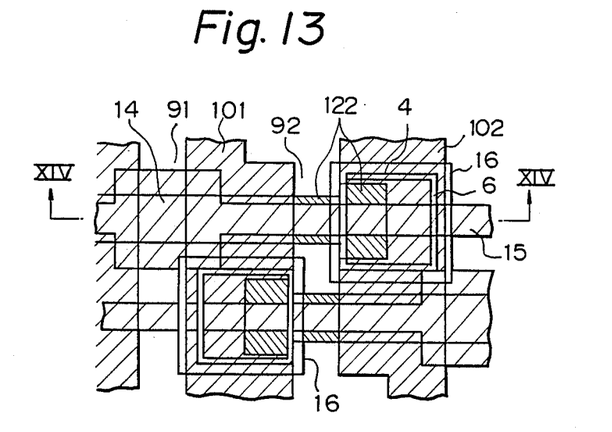
FIG. 13 is a plan view of a dynamic random access memory having a trench capacitor according to a further embodiment of the present invention.
Figure 14:
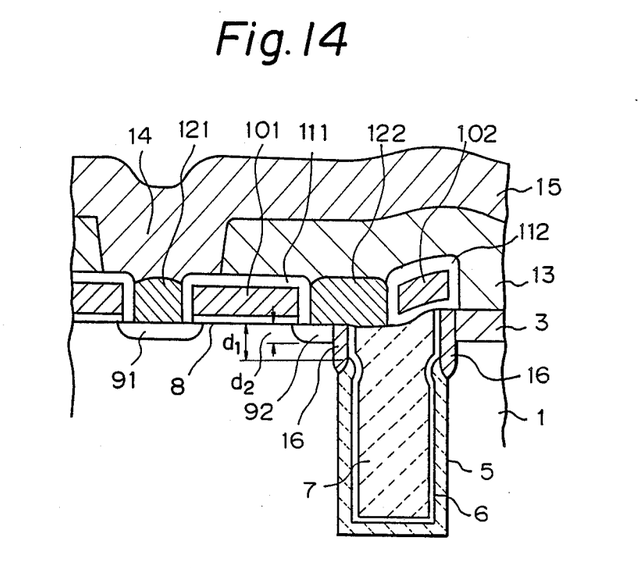
FIG. 14 is a cross-sectional view of FIG. 13 taken along the line XIV—XIV.

A dynamic random access memory having a trench capacitor according to another embodiment of the present invention is shown in FIGS. 13 and 14. A cross-sectional view of FIG. 13 taken along the line XIV—XIV is shown in FIG. 14.

The structure of the memory of FIGS. 13 and 14 is fundamentally the same as that of FIGS. 11 and 12, except that a silicon dioxide insulating layer 16, which is formed by thermal oxidation and has a thickness of, for example, 1000 to 2000 angstroms, which is greater than the thickness of the dielectric layer 6, is arranged in the separation space between the n+ type source or drain region 92 and the p+type cell plate 5.

The existence of the silicon dioxide insulating layer 16, which has a considerable thickness and a high breakdown voltage, between the n+ type source or drain region 92 and the p+ type cell plate 5 further enhances the breakdown voltage of the junction of the source or drain region 92.

((Process of Producing the Memory of FIGS. 13 and 14))

An example of the process of producing the memory of FIGS. 13 and 14 is illustrated in FIGS. 15A, 15B, 16A, 16B, 17A, 17B, 18A, 18B, 19A, 19B, 20A, and 20B. FIGS. 15A to 20A represent plan views, and FIGS. 15B to 20B represent the corresponding cross-sectional views.

Figure 15A:
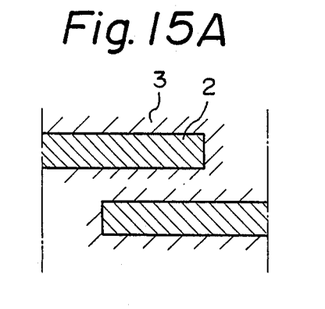
FIGS. 15A, 16A, 17A, 18A, 19A and 20A show examples of the process of producing the memory of FIGS. 13 and 14, in a plan view.
Figure 15B:
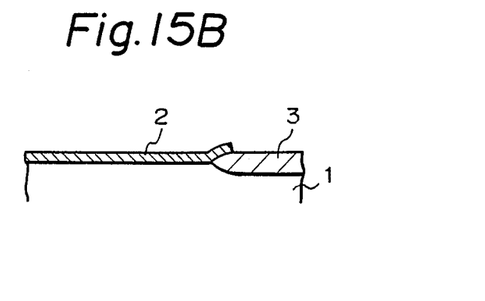
FIGS. 15B, 16B, 17B, 18B, 19B and 20B show cross-sectional views corresponding to FIGS. 15A, 16A, 17A, 18A, 19A and 20A.

As shown in FIGS. 15A and 15B, an oxidization masking layer 2 for selective oxidization consisting of, for example, silicon nitride $Si_3N_4$, or a composite layer of silicon nitride $Si_3N_4$ and silicon dioxide $SiO_2$, is formed on the element formation region of the surface of the p type silicon substrate 1. The silicon substrate 1 is then oxidized so that a silicon dioxide layer 3 having a thickness of, for example, 4000 angstrom, is formed as the isolation layer.

Figure 16A:
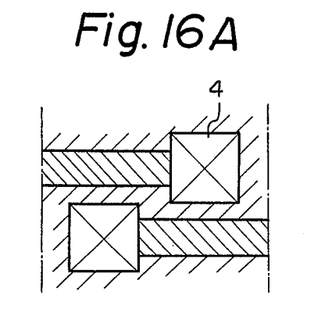
Figure 16B:
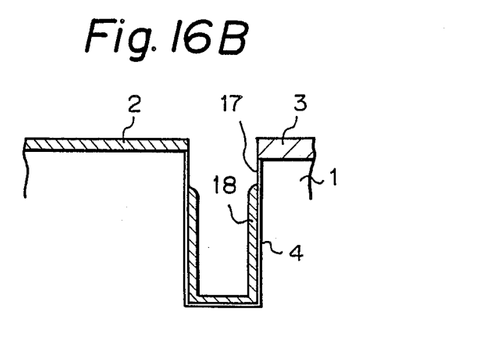

As shown in FIGS. 16A and 16B, a trench 4 having a depth of, for example, 3 to 4 $\mu$m, is formed in the oxidization-resistant region including a portion of the isolation layer 3, by the usual lithographical process and reactive ion etching (RIE) process. Then, thermal oxidization is again carried out, and accordingly, a buffer silicon dioxide layer 17 having a thickness of, for example, 300 angstrom, is formed on the inner surface of the trench 4.

A silicon nitride $Si_3N_4$ layer 18 having a thickness of, for example, 1000 angstrom, is then coated on the entire surface by a chemical vapor deposition process, and an isotropic etching is carried out by a plasma etching process. Thus, a portion of the silicon nitride $Si_3N_4$ layer 18 on the surface of the substrate and in the vicinity of the opening of the trench 4 is removed, so that the silicon nitride $Si_3N_4$ layer 18 is maintained on the inner surface in the vicinity of the bottom of the trench 4, which functions as an oxidization masking layer.

Figure 17A:
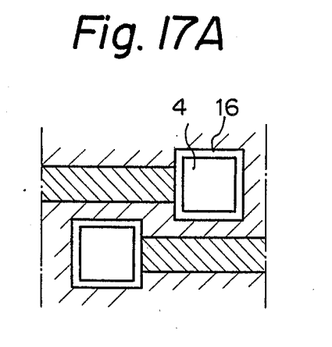
Figure 17B:
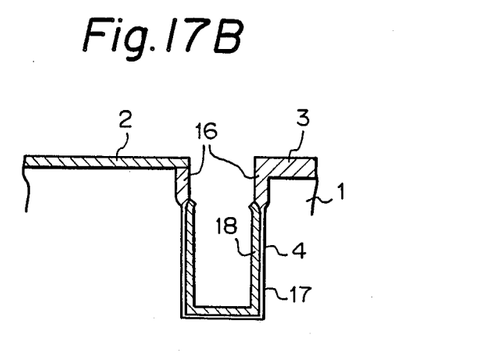

As shown in FIGS. 17A and 17B, a selective oxidization is carried out by using the silicon nitride $Si_3N_4$ layer 18 as a mask, so that a silicon dioxide layer 16 having a thickness of, for example, 1000 angstrom, is formed on the inner surface of the trench 4 except for a portion in the vicinity of the bottom of the trench 4.

Figure 18A:
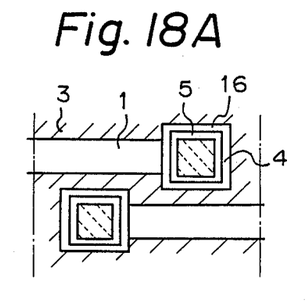
Figure 18B:
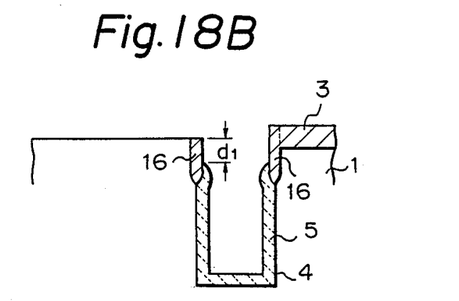

As shown in FIGS. 18A and 18B, the silicon nitride $Si_3N_4$ layers 2 and 18 are removed, and the silicon dioxide layer under these silicon nitride $Si_3N_4$ layers is removed to expose the upper surface of p type silicon substrate 1 and the inner surface of the portion in the vicinity of the bottom of the trench 4. Then, a p+ type polysilicon layer having a thickness of, for example, 1000 angstroms, to which a high concentration boron is doped, is formed on the entire surface of the substrate 1 including the inner surface of the trench 4, by the chemical vapor deposition process. Then, an isotropic etching such as plasma etching is carried out, so that the p+ type poly silicon layer 5 is maintained only in the trench 4.

As shown in FIG. 18B, the upper end of the p+ type polysilicon layer 5 is positioned at a distance $d_1$ lower than the level of the opening of the trench 4, where the distance $d_1$ is larger than the thickness of the source or drain region of the transistor. The value of $d_1$ is, for example, 0.2 to 1 $\mu$m.

In this case, the p+ type polysilicon layer 5 is formed on the inner surface of the trench 4 in order to form a region which is of the same conduction type as the substrate 1 and having a high impurity concentration on the inner surface of the trench 4. Thus, a portion of the substrate 1 acts as the cell plate.

Figure 19A:
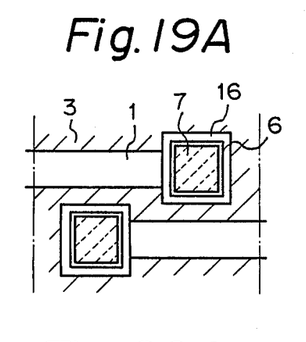
Figure 19B:
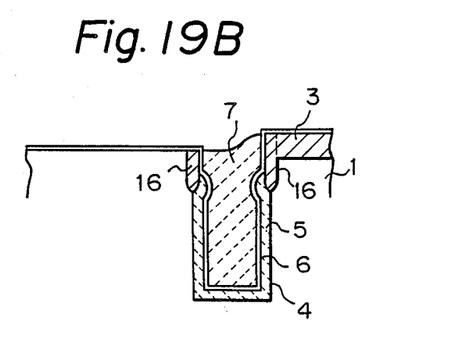

As shown in FIGS. 19A and 19B, a silicon nitride $Si_3N_4$ layer 6, a silicon dioxide layer 6 or a composite layer 6 of silicon nitride $Si_3N_4$ and silicon dioxide, having a thickness of 100 angstrom, is formed on the entire surface of the trench 4 including the inner surface of the trench 4 as a dielectric layer, by an oxidization process or a growth process. It is known that the breakdown voltage of such a dielectric layer can be enhanced by annealing the dielectric layer in an oxygen atmosphere.

Then, a polysilicon layer is grown on the substrate 1 including the inside of the trench 4 to a thickness sufficient to fill the trench 4. The layer is subsequently doped with arsenic or phosphor by ion implantation or diffusion process. Then, the polysilicon layer on the substrate is selectively removed by an isotropic etching process to form an n+ type polysilicon layer 7 filled in the trench 4 through the dielectric layer 6. This n+ type polysilicon layer 7 as the second conductor layer functions as the storage electrode.

Figure 20A:
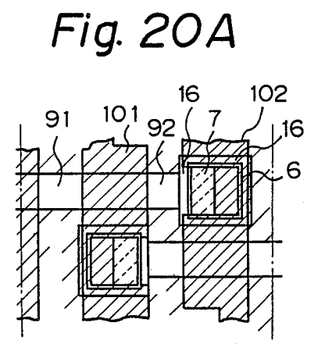
Figure 20B:
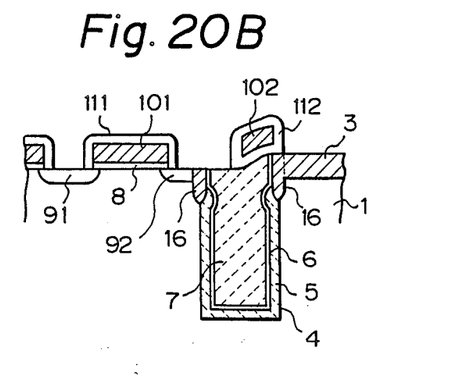

As shown in FIGS. 20A and 20B, the dielectric layer 6 of silicon nitride $Si_3N_4$ appearing outside of the trench 4 is removed to expose the surface of the silicon substrate. Then, the surface of the substrate 1 is oxidized by the usual process for forming a MOS transistor to form a silicon dioxide $SiO_2$ gate dielectric layer 8 having a thickness of, for example 280 angstroms. When the oxidation is carried out at a relatively low temperature, for example, 900° C., the thickness of the silicon dioxide layer 8 on the surface of the n+ type polysilicon layer 7 as the storage electrode becomes, for example, 600 angstrom.

Then, the gate material such as titanium silicide $TiSi_2$ having a thickness of, for example, 4000 angstroms is deposite at the main surface, and this gate material is then coated with the silicon dioxide layer 111 having a thickness of, for example, 1500 angstrom, and a patterning is carried out, so that a pattern of the word line of titanium silicide having the silicon dioxide layer in the upper portion is formed.

Subsequently, a silicon dioxide layer 112 having a thickness of, for example, 1500 angstrom, is again deposited on the main surface. Hence, the silicon dioxide layer 111 or 112 is remained on the upper and side surface of the pattern of word line by anisotropic etching process, and thus the word lines 101 and 102 of titanium silicide covered by silicon dioxide are formed. In this case, the portion of the silicon substrate 1 not covered by the word lines and the surface of the polysilicon layer 7 filled in the trench 4 are exposed.

As shown in FIGS. 9A and 9B, phosphor or arsenic is ion-implanted selectively using the word lines for gate electrodes as the mask in accordance with the usual process to form n+ type source or drain regions 91 and 92. At the same time, an n type impurity introduction region is formed in the n+ type polysilicon layer 7 filled in the trench 4.

Then, a selective growth of a polysilicon layer having a thickness of, for example, 4000 angstroms, to which phosphor or arsenic is doped with high concentration, is carried out on the substrate by the selective vapor phase growth process.

In this case, a polysilicon layer does not grow over the silicon dioxide layers 11 and 3, and third conductor layers 121 and 122 of n+ type polysilicon are formed on the source or drain regions 91 and 92 and the upper region of the n+ type polysilicon layer 7 as the storage electrode. An n+ type polysilicon layer is not grown on the exposed edge of the dielectric layer 6 and the silicon dioxide insulation layer 16. But, since the thickness of the dielectric layer is very small, for example, 100 angstrom, the polysilicon layer over the source or drain region 92 and the polysilicon layer over the storage electrode 7 form the continuous third conductor layer 122, so that the source or drain region 92 becomes conductive with the storage electrode 7.

Subsequently, an inter-layer insulation layer 13 is formed on the entire surface of the substrate, a contact window 14 is formed over the source or drain region 91 where a bit line is in contact with a memory cell, and a bit line 15 consisting of, for example, aluminum, is formed to realize the structure shown in FIGS. 13 and 14.

((Alternative Embodiments))

Instead of the structure of the dynamic random access memory shown in FIGS. 11, 12, 13, and 14, it is possible to adopt an alternative structure in which the storage capacitor is formed partially in the p type substrate and partially in the n type layer expitaxially formed over the p type substrate. In this alternative structure, the transistor is a p type MOS transistor, the second conductive layer is p+ type, and the first conductive layer is p+ type.

Also, instead of the structure of the dynamic random access memory shown in FIGS. 11, 12, 13, and 14 in which the substrate is p type, and the source or drain region and the storage electrode are n+ type, it is possible to adopt an alternative structure in which the substrate is n type, and the source or drain region and the storage electrode are p+ type.

I claim:

1. A dynamic random access memory having a trench capacitor, said memory comprising:
   a semiconductor substrate of one conduction type;
   a trench formed in said semiconductor substrate;
   a first conductive layer formed on a deep portion of an inner surface of said trench and not being formed in a region close to an entrance of said trench;
   a dielectric layer being formed on said first conductive layer in said trench and being formed on said inner surface of said trench in said region close to said entrance of said trench;
   a second conductive layer filling in said trench through said dielectric layer;
   said first conductive layer, said dielectric layer, and said second conductive layer constituting a storage capacitor; and a metal insulator semiconductor transistor formed in said semiconductor substrate, having a source or drain region of another conduction type which is connected to said second conductive layer, said first conductive layer being isolated from said source or drain region.

2. A memory according to claim 1, wherein said second conductive layer is electrically connected with said source or drain region of the another conduction type through a third conductive layer.

3. A memory according to claim 1, wherein an upper end portion of said first conductive layer and a bottom level of said source or drain layer are separated by a predetermined distance.

4. A memory according to claim 3, wherein said predetermined distance is occupied by an insulator material.

5. A memory according to claim 1, wherein source or drain region is adjacent to said second conductive layer through said dielectric layer.

6. A memory according to claim 1, wherein said first conductive layer is in contact with said semiconductor substrate in said trench.

7. A memory according to claim 1, wherein said first conductive layer comprises a polycrystalline silicon.

8. A memory according to claim 1, wherein said dielectric layer has a larger thickness at said surface of said semiconductor substrate than that on said first conductive layer.

* * * * *

(12) EX PARTE REEXAMINATION CERTIFICATE (7196th)
United States Patent
Taguchi (10) Number: US 4,801,989 C1
(45) Certificate Issued: Dec. 1, 2009

(54) DYNAMIC RANDOM ACCESS MEMORY HAVING TRENCH CAPACITOR WITH POLYSILICON LINED LOWER ELECTRODE

(75) Inventor: Masao Taguchi, Sagamihara (JP)

(73) Assignee: Fujitsu Limited, Nakahara-Ku, Kawasaki-Shi, Kanagawa (JP)

Reexamination Request:
No. 90/008,742, Jul. 2, 2007

Reexamination Certificate for:
Patent No.: 4,801,989
Issued: Jan. 31, 1989
Appl. No.: 07/016,611
Filed: Feb. 19, 1987

(30) Foreign Application Priority Data

Feb. 20, 1986 (JP) ............ 61-036361
Mar. 3, 1986 (JP) ............ 61-045822

(51) Int. Cl.
*H01L 27/108* (2006.01)

(52) U.S. Cl. .......... 257/305; 257/E27.092; 365/149
(58) Field of Classification Search .......... 257/302

See application file for complete search history.

(56) References Cited

U.S. PATENT DOCUMENTS

| 4,658,283 A | 4/1987 | Koyama | 257/297 |
| 4,751,558 A | 6/1988 | Kenney | 257/302 |
| 4,791,611 A | * 12/1988 | Eldin et al. | 365/177 |
| 4,901,128 A | 2/1990 | Sunami et al. | |

FOREIGN PATENT DOCUMENTS

| EP | 0 085 988 A2 | 2/1983 |
| EP | 0 201 706 A2 | 4/1986 |

* cited by examiner

*Primary Examiner*—P. Tibbits (57) ABSTRACT

In a dynamic random access memory having a trench capacitor, a first conductive layer is formed on all of the inner surface of the trench except for a region adjacent to the opening portion of the trench, a dielectric layer is formed on the first conductive layer exposed in the trench and the surface of the semiconductor substrate, and a second conductive layer of the other conduction type is filled in the trench through the dielectric layer. The first conductive layer, the dielectric layer, and the second conductive layer constitute a storage capacitor. In this dynamic random access memory, a metal insulator semiconductor transistor is formed in the semiconductor substrate, a source or drain region of the transistor of the other conduction type is in contact with the second conductive layer through the dielectric layer, and the second conductive layer is connected with the source or drain region of the other conduction type.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–6 and 8 is confirmed.

Claim 7 was not reexamined.

* * * * *